(12) United States Patent
Biberger et al.

(10) Patent No.: US 6,926,798 B2
(45) Date of Patent: Aug. 9, 2005

(54) APPARATUS FOR SUPERCRITICAL PROCESSING OF A WORKPIECE

(75) Inventors: Maximilian Albert Biberger, Palo Alto, CA (US); Frederick Paul Layman, Fremont, CA (US); Thomas Robert Sutton, San Jose, CA (US)

(73) Assignee: Tokyo Electron Limited, Tokyo (JP)

( * ) Notice: Subject to any disclaimer, the term of this patent is extended or adjusted under 35 U.S.C. 154(b) by 28 days.

(21) Appl. No.: 10/384,096

(22) Filed: Mar. 6, 2003

(65) Prior Publication Data

US 2003/0150559 A1 Aug. 14, 2003

Related U.S. Application Data

(63) Continuation of application No. 09/704,641, filed on Nov. 1, 2000.
(60) Provisional application No. 60/163,121, filed on Nov. 2, 1999.

(51) Int. Cl.⁷ .......................... H01L 21/00; C23C 16/00
(52) U.S. Cl. .......................... 156/345.31; 156/345.32; 156/345.51; 118/719; 118/715; 414/935; 430/329; 134/61; 134/1.2; 134/1.3
(58) Field of Search ......................... 118/715, 719; 156/345.31, 345.32, 345.51; 414/935, 939; 430/329; 134/61, 1.2, 1.3

(56) References Cited

U.S. PATENT DOCUMENTS

| | | |
|---|---|---|
| 2,617,719 A | 11/1952 | Stewart |
| 2,625,886 A | 1/1953 | Browne |
| 3,623,627 A | 8/1969 | Bolton |
| 3,689,025 A | 9/1972 | Kiser |
| 3,744,660 A | 7/1973 | Gaines et al. |
| 3,968,885 A | 7/1976 | Hassan et al. |
| 4,029,517 A | 6/1977 | Rand |

(Continued)

FOREIGN PATENT DOCUMENTS

| | | | | |
|---|---|---|---|---|
| CH | SE 251213 | 8/1948 | | |
| CN | 1399790 A | 2/2003 | ........... | H01L/21/00 |
| DE | 36 08 783 A1 | 9/1987 | ........... | C30B/25/12 |

(Continued)

OTHER PUBLICATIONS

Edward Bok (Article Super critical Fluids for Single wafer Cleaning, Solid State Technology, Jun. 1992).*
Hideaki Itakura et al., "Multi–Chamber Dry Etching System", Solid State Technology, Apr. 1982, pp. 209–214.

(Continued)

*Primary Examiner*—Gregory Mills
*Assistant Examiner*—Ram N Kackar
(74) *Attorney, Agent, or Firm*—Haverstock & Owens LLP

(57) ABSTRACT

An apparatus for supercritical processing and non-supercritical processing of a workpiece comprises a transfer module, a supercritical processing module, a non-supercritical processing module, and a robot. The transfer module includes an entrance. The supercritical processing module and the non-supercritical processing module are coupled to the transfer module. The robot is preferably located within the transfer module. In operation, the robot transfers a workpiece from the entrance of the transfer module to the supercritical processing module. After supercritical processing, the robot then transfers workpiece from the supercritical processing module to the non-supercritical processing module. After the non-supercritical processing, the robot returns the workpiece to the entrance of the transfer module. Alternatively, the non-supercritical processing is performed before the supercritical processing.

16 Claims, 9 Drawing Sheets

U.S. PATENT DOCUMENTS

| | | | |
|---|---|---|---|
| 4,091,643 A | 5/1978 | Zucchini | |
| 4,245,154 A | 1/1981 | Uehara et al. | |
| 4,341,592 A | 7/1982 | Shortes et al. | |
| 4,355,937 A | 10/1982 | Mack et al. | |
| 4,367,140 A | 1/1983 | Wilson | |
| 4,406,596 A | 9/1983 | Budde | |
| 4,422,651 A | 12/1983 | Platts | |
| 4,426,358 A | 1/1984 | Johansson | |
| 4,474,199 A | 10/1984 | Blaudszun | |
| 4,522,788 A | 6/1985 | Sitek et al. | |
| 4,549,467 A | 10/1985 | Wilden et al. | |
| 4,574,184 A | 3/1986 | Wolf et al. | |
| 4,592,306 A | 6/1986 | Gallego | |
| 4,601,181 A | 7/1986 | Privat | |
| 4,626,509 A | 12/1986 | Lyman | |
| 4,670,126 A | 6/1987 | Messer et al. | |
| 4,682,937 A | 7/1987 | Credle, Jr. | |
| 4,693,777 A | 9/1987 | Hazano et al. | |
| 4,749,440 A | 6/1988 | Blackwood et al. | |
| 4,778,356 A | 10/1988 | Hicks | |
| 4,788,043 A | 11/1988 | Kagiyama et al. | |
| 4,789,077 A | 12/1988 | Noe | |
| 4,823,976 A | 4/1989 | White, III et al. | |
| 4,825,808 A | 5/1989 | Takahashi et al. | |
| 4,827,867 A | 5/1989 | Takei et al. | |
| 4,838,476 A | 6/1989 | Rahn | |
| 4,865,061 A | 9/1989 | Fowler et al. | |
| 4,879,431 A | 11/1989 | Bertoncini | |
| 4,917,556 A | 4/1990 | Stark et al. | |
| 4,924,892 A | 5/1990 | Kiba et al. | |
| 4,951,601 A | 8/1990 | Maydan et al. | |
| 4,960,140 A | 10/1990 | Ishijima et al. | |
| 4,983,223 A | 1/1991 | Gessner | |
| 5,011,542 A | 4/1991 | Weil | |
| 5,044,871 A | 9/1991 | Davis et al. | |
| 5,062,770 A | 11/1991 | Story et al. | |
| 5,071,485 A | 12/1991 | Matthews et al. | |
| 5,105,556 A | 4/1992 | Kurokawa et al. | |
| 5,143,103 A | 9/1992 | Basso et al. | |
| 5,167,716 A | 12/1992 | Boitnott et al. | |
| 5,169,296 A | 12/1992 | Wilden | |
| 5,185,296 A | 2/1993 | Morita et al. | |
| 5,186,594 A | 2/1993 | Toshima et al. | |
| 5,186,718 A | 2/1993 | Tepman et al. | |
| 5,188,515 A | 2/1993 | Horn | |
| 5,190,373 A | 3/1993 | Dickson et al. | |
| 5,191,993 A | 3/1993 | Wanger et al. | |
| 5,193,560 A | 3/1993 | Tanaka et al. | |
| 5,195,878 A | 3/1993 | Sahiavo et al. | |
| 5,213,485 A | 5/1993 | Wilden | |
| 5,217,043 A | 6/1993 | Novakovi | |
| 5,221,019 A | 6/1993 | Pechacek et al. | |
| 5,222,876 A | 6/1993 | Budde | |
| 5,224,504 A | 7/1993 | Thompson et al. | |
| 5,236,669 A | 8/1993 | Simmons et al. | |
| 5,237,824 A | 8/1993 | Pawliszyn | |
| 5,240,390 A | 8/1993 | Kvinge et al. | |
| 5,243,821 A | 9/1993 | Schuck et al. | |
| 5,246,500 A | 9/1993 | Samata et al. | |
| 5,251,776 A | 10/1993 | Morgan, Jr. et al. | |
| 5,267,455 A | 12/1993 | Dewees et al. | |
| 5,280,693 A | 1/1994 | Heudecker | |
| 5,285,352 A | 2/1994 | Pastore et al. | |
| 5,288,333 A | 2/1994 | Tanaka et al. | |
| 5,313,965 A | 5/1994 | Palen | |
| 5,314,574 A | 5/1994 | Takahashi | |
| 5,328,722 A | 7/1994 | Ghanayem et al. | |
| 5,337,446 A | 8/1994 | Smith et al. | |
| 5,339,844 A | 8/1994 | Stanford, Jr. et al. | |
| 5,355,901 A | 10/1994 | Mielnik et al. | |
| 5,368,171 A | 11/1994 | Jackson | |
| 5,370,741 A | 12/1994 | Bergman | |
| 5,374,829 A | 12/1994 | Sakamoto et al. | |
| 5,377,705 A | 1/1995 | Smith, Jr. et al. | |
| 5,401,322 A | 3/1995 | Marshall | |
| 5,404,894 A | 4/1995 | Shiraiwa | |
| 5,412,958 A | 5/1995 | Iliff et al. | |
| 5,417,768 A | 5/1995 | Smith, Jr. et al. | |
| 5,433,334 A | 7/1995 | Reneau | |
| 5,447,294 A | 9/1995 | Sakata et al. | |
| 5,474,410 A | 12/1995 | Ozawa et al. | |
| 5,503,176 A | 4/1996 | Dunmire et al. | |
| 5,505,219 A | 4/1996 | Lansberry et al. | |
| 5,509,431 A * | 4/1996 | Smith et al. | 134/95.1 |
| 5,526,834 A | 6/1996 | Mielnik et al. | |
| 5,533,538 A | 7/1996 | Marshall | |
| 5,571,330 A | 11/1996 | Kyogoku | |
| 5,589,224 A | 12/1996 | Tepman et al. | |
| 5,621,982 A | 4/1997 | Yamashita et al. | |
| 5,629,918 A | 5/1997 | Ho et al. | |
| 5,644,855 A | 7/1997 | McDermott et al. | |
| 5,649,809 A | 7/1997 | Stapelfeldt | |
| 5,656,097 A | 8/1997 | Olesen et al. | |
| 5,669,251 A | 9/1997 | Townsend et al. | |
| 5,672,204 A | 9/1997 | Habuka | 117/204 |
| 5,679,169 A | 10/1997 | Gonzales et al. | |
| 5,702,228 A | 12/1997 | Tamai et al. | |
| 5,706,319 A | 1/1998 | Holtz | |
| 5,746,008 A | 5/1998 | Yamashita et al. | |
| 5,769,588 A | 6/1998 | Toshima et al. | |
| 5,797,719 A | 8/1998 | James et al. | |
| 5,798,126 A | 8/1998 | Fijikawa et al. | |
| 5,817,178 A | 10/1998 | Mita et al. | 118/666 |
| 5,879,459 A | 3/1999 | Gadgil et al. | |
| 5,881,577 A | 3/1999 | Sauer et al. | |
| 5,882,165 A | 3/1999 | Maydan et al. | |
| 5,888,050 A | 3/1999 | Fitzgerald et al. | |
| 5,898,727 A | 4/1999 | Fujikawa et al. | |
| 5,900,107 A | 5/1999 | Murphy et al. | |
| 5,904,737 A | 5/1999 | Preston et al. | |
| 5,906,866 A | 5/1999 | Webb | |
| 5,928,389 A | 7/1999 | Jevtic | |
| 5,932,100 A | 8/1999 | Yager et al. | |
| 5,934,856 A | 8/1999 | Asakawa et al. | |
| 5,934,991 A | 8/1999 | Rush | |
| 5,975,492 A | 11/1999 | Brenes | |
| 5,979,306 A * | 11/1999 | Fujikawa et al. | 100/90 |
| 5,980,648 A | 11/1999 | Adler | |
| 5,981,399 A | 11/1999 | Kawamura et al. | |
| 5,989,342 A | 11/1999 | Ikeda et al. | |
| 6,005,226 A | 12/1999 | Aschner et al. | |
| 6,017,820 A | 1/2000 | Ting et al. | |
| 6,021,791 A | 2/2000 | Dryer et al. | |
| 6,029,371 A | 2/2000 | Kamikawa et al. | |
| 6,035,871 A | 3/2000 | Eui-Yeol | |
| 6,037,277 A | 3/2000 | Masakara et al. | |
| 6,048,494 A | 4/2000 | Annapragada | |
| 6,053,348 A | 4/2000 | Morch | |
| 6,056,008 A | 5/2000 | Adams et al. | |
| 6,062,853 A | 5/2000 | Shimazu et al. | |
| 6,067,728 A | 5/2000 | Farmer et al. | |
| 6,077,053 A | 6/2000 | Fujikawa et al. | |
| 6,077,321 A * | 6/2000 | Adachi et al. | 29/25.01 |
| 6,082,150 A | 7/2000 | Stucker | |
| 6,085,935 A | 7/2000 | Malchow et al. | |
| 6,089,377 A | 7/2000 | Shimizu | |
| 6,097,015 A | 8/2000 | McCullough et al. | |
| 6,109,296 A | 8/2000 | Austin | |
| 6,110,232 A * | 8/2000 | Chen et al. | 29/25.01 |
| 6,122,566 A | 9/2000 | Nguyen et al. | |
| 6,128,830 A | 10/2000 | Bettcher et al. | |

| | | |
|---|---|---|
| 6,145,519 A | 11/2000 | Konishi et al. |
| 6,159,295 A | 12/2000 | Maskara et al. |
| 6,164,297 A | 12/2000 | Kamikawa |
| 6,186,722 B1 | 2/2001 | Shirai |
| 6,203,582 B1 | 3/2001 | Berner et al. |
| 6,216,364 B1 | 4/2001 | Tanaka et al. |
| 6,228,563 B1 | 5/2001 | Starov et al. |
| 6,235,634 B1 | 5/2001 | White et al. |
| 6,239,038 B1 | 5/2001 | Wen |
| 6,241,825 B1 | 6/2001 | Wytman |
| 6,244,121 B1 | 6/2001 | Hunter |
| 6,251,250 B1 | 6/2001 | Keigler |
| 6,277,753 B1 | 8/2001 | Mullee et al. |
| 6,286,231 B1 | 9/2001 | Bergman et al. |
| 6,305,677 B1 | 10/2001 | Lenz |
| 6,319,858 B1 | 11/2001 | Lee et al. ............... 438/787 |
| 6,334,266 B1 | 1/2002 | Moritz et al. |
| 6,344,174 B1 | 2/2002 | Miller et al. |
| 6,355,072 B1 | 3/2002 | Racette et al. |
| 6,388,317 B1 | 5/2002 | Reese |
| 6,389,677 B1 | 5/2002 | Lenz |
| 6,406,782 B2 | 6/2002 | Johnson et al. |
| 6,418,956 B1 | 7/2002 | Bloom |
| 6,436,824 B1 | 8/2002 | Chooi et al. |
| 6,454,519 B1 | 9/2002 | Toshima et al. |
| 6,454,945 B1 | 9/2002 | Weigl et al. |
| 6,464,790 B1 | 10/2002 | Sherstinsky et al. |
| 6,465,403 B1 | 10/2002 | Skee |
| 6,508,259 B1 | 1/2003 | Tseronis et al. ............. 134/105 |
| 6,509,141 B2 | 1/2003 | Mullee |
| 6,521,466 B1 | 2/2003 | Castrucci |
| 6,541,278 B2 | 4/2003 | Morita et al. |
| 6,546,946 B2 | 4/2003 | Dunmire |
| 6,550,484 B1 | 4/2003 | Gopinath et al. |
| 6,558,475 B1 | 5/2003 | Jur et al. |
| 6,561,213 B2 | 5/2003 | Wang et al. |
| 6,561,220 B2 | 5/2003 | McCullough et al. |
| 6,561,481 B1 | 5/2003 | Filonczuk |
| 6,561,767 B2 | 5/2003 | Berger et al. |
| 6,564,826 B2 | 5/2003 | Shen |
| 6,635,565 B2 | 10/2003 | Wu et al. |
| 6,641,678 B2 | 11/2003 | DeYoung et al. |
| 2001/0050096 A1 | 12/2001 | Costantini et al. |
| 2002/0001929 A1 | 1/2002 | Biberger et al. |
| 2003/0205510 A1 | 11/2003 | Jackson |
| 2004/0020518 A1 | 2/2004 | DeYoung et al. |

FOREIGN PATENT DOCUMENTS

| | | | |
|---|---|---|---|
| DE | 198 60 084 A1 | 7/2000 | ....... H01L/21/3213 |
| EP | 0 244 951 A2 | 11/1987 | ........... H01L/21/00 |
| EP | 0 272 141 A2 | 6/1988 | ........... H01L/21/00 |
| EP | 0 453 867 A1 | 10/1991 | ........... F16K/51/02 |
| EP | 0 572 913 A1 | 12/1993 | ........... B01D/11/02 |
| EP | 0 587 168 A1 | 3/1994 | ............. B08B/7/00 |
| EP | 0 679 753 B1 | 11/1995 | ........... D06F/43/00 |
| EP | 0 903 775 A2 | 3/1999 | ........... H01L/21/00 |
| FR | 1 499 491 | 9/1967 | |
| GB | 2 003 975 | 3/1979 | ........... F04B/43/06 |
| GB | 2 193 482 | 2/1988 | ............. B25J/18/02 |
| JP | 56-142629 | 11/1981 | ......... H01L/21/205 |
| JP | 60-238479 | 11/1985 | ........... C23C/14/56 |
| JP | 60-246635 | 12/1985 | ......... H01L/21/302 |
| JP | 61-017151 | 1/1986 | ........... G03G/5/082 |
| JP | 61-231166 | 10/1986 | ........... C23C/14/24 |
| JP | 62-125619 | 6/1987 | ........... H01L/21/30 |
| JP | 63-303059 | 12/1988 | ........... C23C/14/22 |
| JP | 2-148841 | 6/1990 | ......... H01L/21/306 |
| JP | 2-209729 | 8/1990 | ........ H01L/21/302 |
| JP | 8-186140 | 7/1996 | ........... H01L/21/56 |
| JP | 08206485 A * | 8/1996 | .............. B01J/3/06 |
| JP | 10-144757 | 5/1998 | ........... H01L/21/68 |
| JP | 10-335408 | 12/1998 | ........... H01L/21/31 |
| JP | 11-200035 | 7/1999 | ........... C23C/14/34 |
| JP | 2000106358 A * | 4/2000 | ....... H01L/21/3065 |
| JP | 2000/106358 | 4/2000 | ....... H01L/21/3065 |
| WO | WO 87/07309 | 12/1987 | ........... C23C/16/00 |
| WO | WO 91/12629 | 8/1991 | ........... H01L/21/00 |
| WO | WO 99/18603 | 4/1999 | ........... H01L/21/00 |
| WO | WO 00/36635 | 6/2000 | ........... H01L/21/00 |
| WO | WO 01/10733 A1 | 2/2001 | ........... B65D/55/00 |
| WO | WO 01/33615 A3 | 5/2001 | ........... H01L/21/00 |
| WO | WO 01/55628 A1 | 8/2001 | ........... F16K/51/02 |
| WO | WO 01/68279 A2 | 9/2001 | ............. B08B/7/00 |
| WO | WO 01/74538 A1 | 10/2001 | ............. B24C/1/00 |
| WO | WO 01/78911 A1 | 10/2001 | ............. B08B/3/00 |
| WO | WO 01/85391 A2 | 11/2001 | |
| WO | WO 01/94782 A3 | 12/2001 | ........... F04B/43/02 |
| WO | WO 02/16051 A2 | 2/2002 | |
| WO | WO 03/030219 A2 | 10/2003 | |

OTHER PUBLICATIONS

Sun, Y.P. et al., "Preparation of Polymer–Protected Semiconductor Nanoparticles Through the Rapid Expansion of Supercritical Fluid Solution," Chemical Physics Letters, pp. 585–588, May 22, 1998.

Dahmen, N. et al., "Supercritical Fluid Extraction of Grinding and Metal Cutting Waste Contaminated with Oils," Supercritical Fluids—Extraction and Pollution Prevention, ACS Symposium Series, vol. 670, pp. 270–279, Oct. 21, 1997.

Xu, C. et al., "Submicron–Sized Spherical Yttrium Oxide Based Phosphors Prepared by Supercritical CO2–Assisted aerosolization and pyrolysis," Appl. Phys. Lett., vol. 71, No. 12, Sep. 22, 1997, pp. 1643–1645.

Courtecuisse, V.G. et al., "Kinetics of the Titanium Isopropoxide Decomposition in Supercritical Isopropyl Alcohol," Ind. Eng. Chem. Res., vol. 35, No. 8, pp. 2539–2545, Aug. 1996.

Gallagher–Wetmore, P. et al., "Supercritical Fluid Processing: A New Dry Technique for Photoresist Developing," SPIE vol. 2438, pp. 694–708, Jun. 1995.

McHardy, J. et al., "Progress in Supercritical CO2 Cleaning," SAMPE Jour., vol. 29, No. 5, pp. 20–27, Sep. 1993.

Purtell, R, et al., "Precision Parts Cleaning using Supercritical Fluids," J. Vac, Sci, Technol. A. vol. 11, No. 4, Jul. 1993, pp. 1696–1701.

Hansen, B.N. et al., "Supercritical Fluid Transport—Chemical Deposition of Films,"Chem. Mater., vol. 4, No. 4, pp. 749–752, 1992.

Hybertson, B.M. et al., "Deposition of Palladium Films by a Novel Supercritical Fluid Transport Chemical Deposition Process," Mat. Res. Bull., vol. 26, pp. 1127–1133, 1991.

Ziger, D. H. et al., "Compressed Fluid Technology: Application to RIE–Developed Resists," AiChE Jour., vol. 33, No. 10, pp. 1585–1591, Oct. 1987.

Matson, D.W. et al., "Rapid Expansion of Supercritical Fluid Solutions: Solute Formation of Powders, Thin Films, and Fibers," Ind. Eng. Chem. Res., vol. 26, No. 11, pp. 2298–2306, 1987.

Tolley, W.K. et al., "Stripping Organics from Metal and Mineral Surfaces using Supercritical Fluids," Separation Science and Technology, vol. 22, pp. 1087–1101, 1987.

Joseph L. Foszcz, "Diaphragm Pumps Eliminate Seal Problems", Plant Engineering, pp. 1–5, Feb. 1, 1996.

Bob Agnew, "WILDEN Air–Operated Diaphragm Pumps", Process & Industrial Training Technologies, Inc., 1996.

* cited by examiner

APPARATUS FOR SUPERCRITICAL PROCESSING OF A WORKPIECE

RELATED APPLICATIONS

This patent application is a continuation application of the co-pending U.S. patent application Ser. No. 09/704,641, filed Nov. 1, 2000, and titled "METHOD AND APPARATUS FOR SUPERCRITICAL PROCESSING OF A WORKPIECE," which claims priority from U.S. Provisional Patent Application Ser. No. 60/163,121, filed Nov. 2, 1999, and titled "A HIGH THROUGHPUT CLUSTER TOOL FOR CLEANING SEMICONDUCTOR DEVICES USING SUPERCRITICAL CO2." The U.S. patent application Ser. No. 09/704,641, filed Nov. 1, 2000, and titled "METHOD AND APPARATUS FOR SUPERCRITICAL PROCESSING OF A WORKPIECE," is hereby incorporated by reference.

FIELD OF THE INVENTION

This invention relates to the field of supercritical processing. More particularly, this invention relates to the field of supercritical processing where a workpiece is processed in a supercritical environment and where the workpiece is processed in a non-supercritical environment.

BACKGROUND OF THE INVENTION

Semiconductor fabrication uses photoresist in ion implantation, etching, and other processing steps. In the ion implantation steps, the photoresist masks areas of a semiconductor substrate that are not implanted with a dopant. In the etching steps, the photoresist masks areas of the semiconductor substrate that are not etched. Examples of the other processing steps include using the photoresist as a blanket protective coating of a processed wafer or the blanket protective coating of a MEMS (micro electromechanical system) device. Following the ion implantation steps, the photoresist exhibits a hard outer crust covering a jelly-like core. The hard outer crust leads to difficulties in a photoresist removal. Following the etching steps, remaining photoresist exhibits a hardened character that leads to difficulties in the photoresist removal. Following the etching steps, residue (photoresist residue mixed with etch residue) coats sidewalls of etch features. Depending on a type of etching step and material etched, the photoresist residue mixed with the etch residue presents a challenging removal problem since the photoresist residue mixed with the etch residue often strongly bond to the sidewalls of the etch features.

Typically, in the prior art, the photoresist and the residue are removed by plasma ashing in an $O_2$ plasma followed by cleaning in a wet-clean bath. A semiconductor etching and metallization process of the prior art is illustrated in block diagram format in FIG. 1. The semiconductor etching and metallization process 10 includes a photoresist application step 12, a photoresist exposure step 14, a photoresist development step 16, a dielectric etch step 18, an ashing step 20, a wet cleaning step 22, and a metal deposition step 24. In the photoresist application step 12, the photoresist is applied to a wafer having an exposed oxide layer. In the photoresist exposure step 14, the photoresist is exposed to light which is partially blocked by a mask.

Depending upon whether the photoresist is a positive or negative photoresist, either exposed photoresist or non-exposed photoresist, respectively, is removed in the photoresist development step 16 leaving a exposed pattern on the oxide layer. In the dielectric etch step 18, the exposed pattern on the oxide layer is etched in an RIE (reactive ion etch) process which etches the exposed pattern into the oxide layer, forming an etched pattern, while also partially etching the photoresist. This produces the residue which coats the sidewalls of the etch features while also hardening the photoresist. In the ashing step 20, the $O_2$ plasma oxidizes and partially removes the photoresist and the residue. In the wet cleaning step 22, remaining photoresist and residue is cleaned in the wet-clean bath.

In the metal deposition step 24, a metal layer is deposited on the wafer filling the etched pattern and also covering non-etched regions. In subsequent processing, at least part of the metal covering non-etched regions is removed in order to form a circuit.

Nishikawa et al. in U.S. Pat. No. 4,944,837, issued on Jul. 31, 1990, recite a prior art method of removing a resist using liquidized or supercritical gas. A substrate with the resist is placed into a pressure vessel, which also contains the liquidized or supercritical gas. After a predetermined time lapse, the liquidized or supercritical gas is rapidly expanded, which removes the resist.

Nishikawa et al. teach that supercritical $CO_2$ can be used as a developer for photoresist. A substrate with a photoresist layer is exposed in a pattern to light, thus forming a latent image. The substrate with the photoresist and the latent image is placed in a supercritical $CO_2$ bath for 30 minutes. The supercritical $CO_2$ is then condensed leaving the pattern of the photoresist. Nishikawa et al. further teach that 0.5% by weight of methyl isobutyl ketone (MIBK) can be added to the supercritical $CO_2$, which increases an effectiveness of the supercritical $CO_2$ and, thus, reduces a development time from the 30 minutes to 5 minutes.

Nishikawa et al. also teach that a photoresist can be removed using the supercritical $CO_2$ and 7% by weight of the MIBK. The substrate with the photoresist is placed in the supercritical $CO_2$ and the MIBK for 30–45 minutes. Upon condensing the supercritical $CO_2$, the photoresist has been removed.

The methods taught by Nishikawa et al. are inappropriate for a semiconductor fabrication line for a number of reasons. Rapidly expanding a liquidized or supercritical gas to remove a photoresist from a substrate creates a potential for breakage of the substrate. A photoresist development process which takes 30 minutes is too inefficient. A photoresist development or removal process which uses MIBK is not preferred because MIBK is toxic and because MIBK is used only when a more suitable choice is unavailable.

Smith, Jr. et al. in U.S. Pat. No. 5,377,705, issued on Jan. 3, 1995, teach a system for cleaning contaminants from a workpiece. The contaminants include organic, particulate, and ionic contaminants. The system includes a pressurizable cleaning vessel, a liquid $CO_2$ storage container, a pump, a solvent delivery system, a separator, a condenser, and various valves. The pump transfers $CO_2$ gas and solvent to the cleaning vessel and pressurizes the $CO_2$ gas to supercritical $CO_2$. The supercritical $CO_2$ and the solvent remove the contaminants from the workpiece. A valve allows some of the supercritical $CO_2$ and the solvent to bleed from the cleaning vessel while the pump replenishes the supercritical $CO_2$ and the solvent. The separator separates the solvent from the supercritical $CO_2$. The condenser condenses the $CO_2$ to liquid $CO_2$ so that the liquid $CO_2$ storage container can be replenished.

Employing a system such as taught by Smith, Jr. et al. for removing photoresist and residue presents a number of difficulties. The pressurizable cleaning vessel is not configured appropriately for semiconductor substrate handling. It is inefficient to bleed the supercritical $CO_2$ and the solvent during cleaning. Such a system is not readily adaptable to throughput requirements of a semiconductor fabrication line. Such a system is not conducive to safe semiconductor substrate handling, which is crucial in a semiconductor fabrication line. Such a system is not economical for semiconductor substrate processing.

What is needed is a method of developing photoresist using supercritical carbon dioxide appropriate for a semiconductor fabrication line.

What is needed is a method of removing photoresist using supercritical carbon dioxide appropriate for a semiconductor fabrication line.

What is needed is a supercritical processing system which is configured for handling semiconductor substrates.

What is needed is a supercritical processing system in which supercritical $CO_2$ and solvent are not necessarily bled from a processing chamber in order to create a fluid flow within the processing chamber.

What is needed is a supercritical processing system which meets throughput requirements of a semiconductor fabrication line.

What is needed is a supercritical processing system which provides safe semiconductor substrate handling.

What is needed is a supercritical processing system which provides economical semiconductor substrate processing.

What is needed is an apparatus which combines an etch process and a supercritical process.

What is needed is an apparatus which combines a deposition process and a supercritical process.

What is needed is an apparatus which combines a supercritical process and a non-supercritical process.

SUMMARY OF THE INVENTION

The present invention is an apparatus for supercritical processing and non-supercritical processing of a workpiece. The apparatus includes a transfer module, a supercritical processing module, a non-supercritical processing module, and a robot. The transfer module includes an entrance. The supercritical processing module and the non-supercritical processing module are coupled to the transfer module. The robot is preferably located within the transfer module. In operation, the robot transfers a workpiece from the entrance of the transfer module to the supercritical processing module. After supercritical processing, the robot then transfers the workpiece from the supercritical processing module to the non-supercritical processing module. After the non-supercritical processing, the robot returns the workpiece to the entrance of the transfer module. Alternatively, the non-supercritical processing is performed before the supercritical processing.

DETAILED DESCRIPTION OF THE PREFERRED EMBODIMENT

Figure 1:
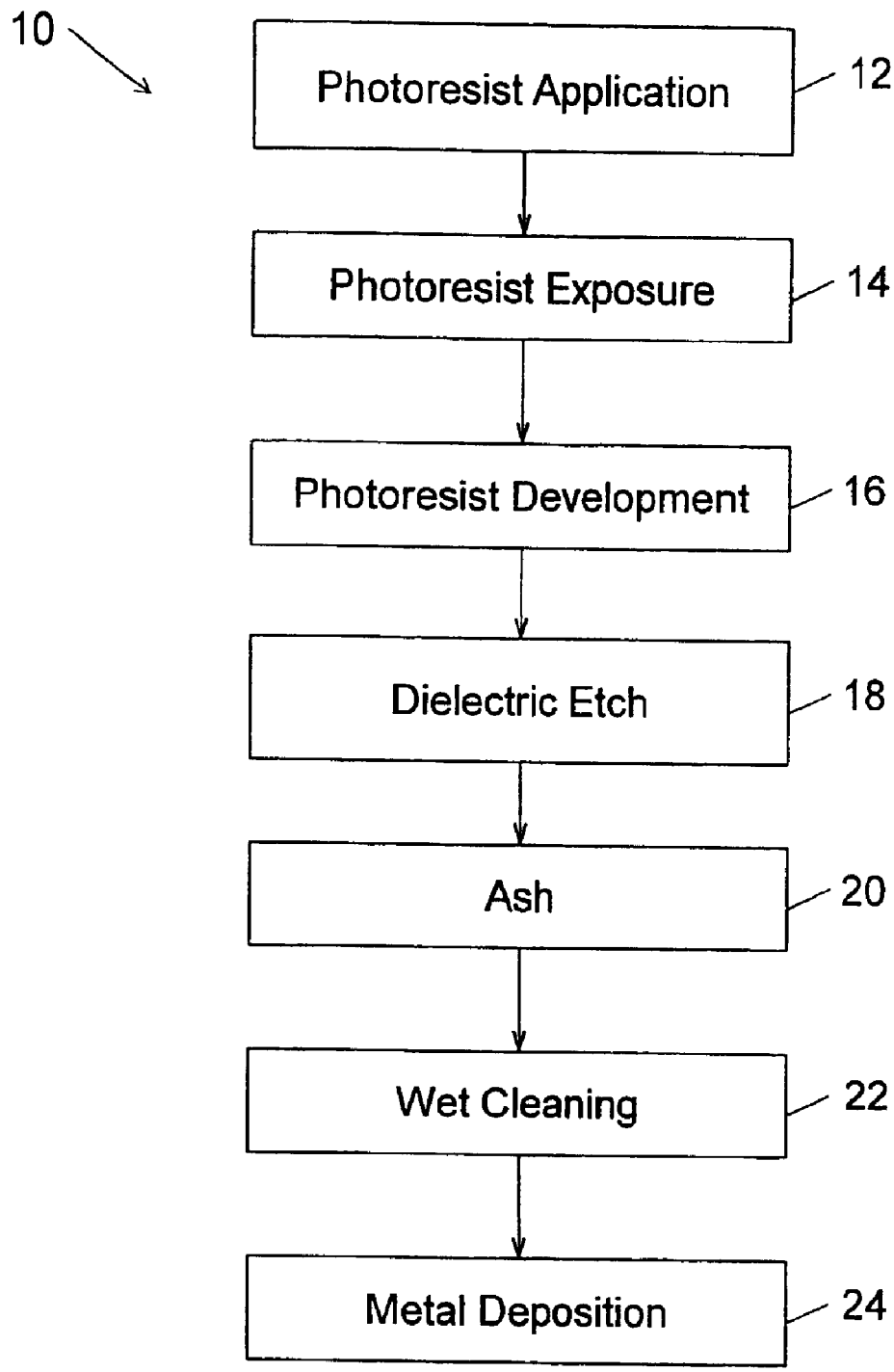
FIG. 1 illustrates, in block diagram format, a process flow for a semiconductor etching and metallization process of the prior art.
Figure 2:
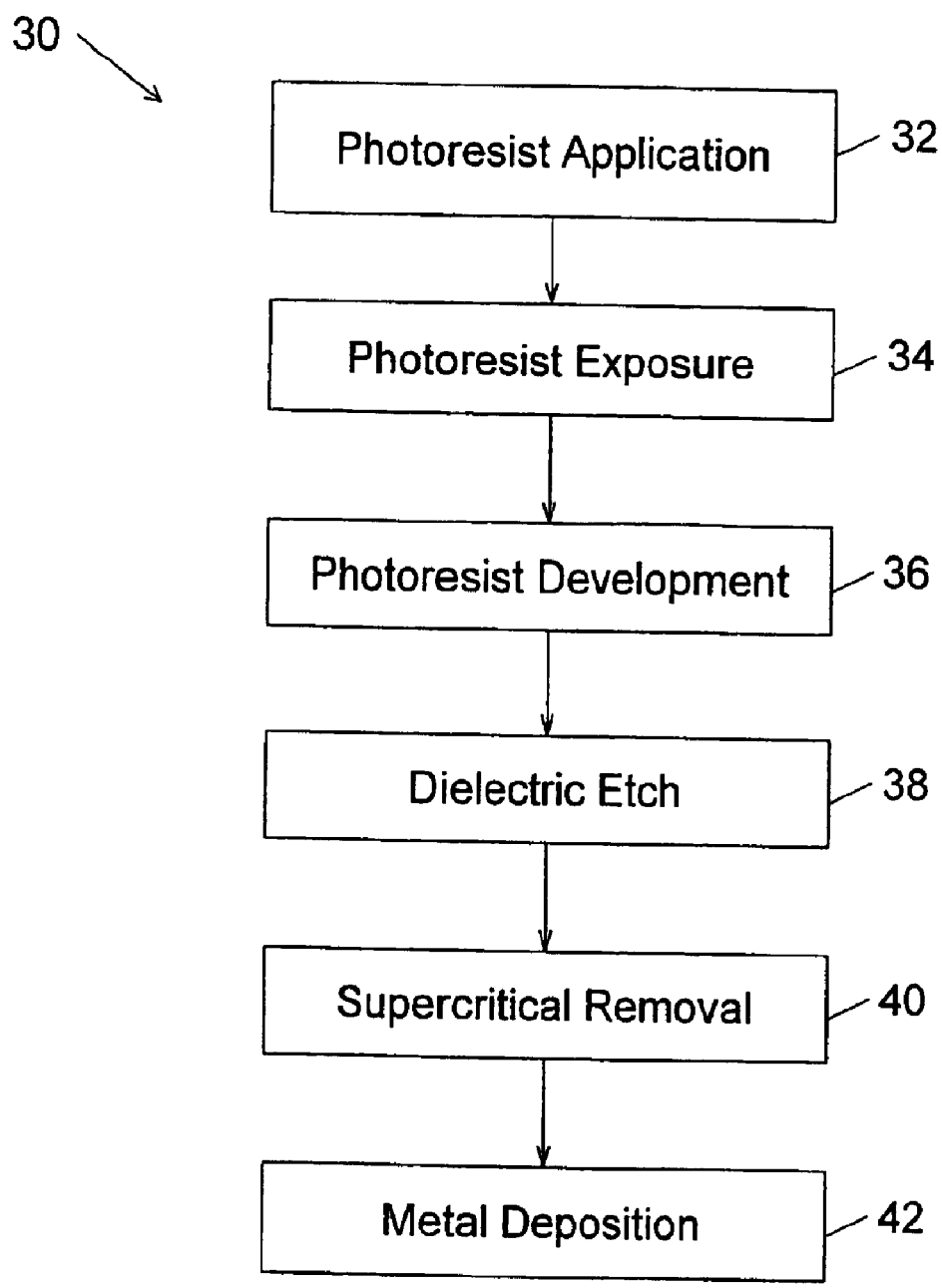
FIG. 2 illustrates, in block diagram format, a process flow for a semiconductor etching and metallization process of the present invention.

A semiconductor etch and metallization process of the present invention is illustrated, as a block diagram, in FIG. 2. The semiconductor etch and metallization process 30 includes a photoresist application step 32, a photoresist exposure step 34, a photoresist development step 36, a dielectric etch step 38, a supercritical removal process 40, and a metal deposition step 42. In the photoresist application step 32, the photoresist is applied to a wafer having an exposed oxide layer. In the photoresist exposure step 34, the photoresist is exposed to light which is partially blocked by a mask.

Depending upon whether the photoresist is a positive or negative photoresist, either exposed photoresist or non-exposed photoresist, respectively, is removed in the photoresist development step 36 leaving a exposed pattern on the oxide layer. In the dielectric etch step 38, the exposed pattern on the oxide layer is preferably etched in an RIE (reactive ion etch) process which etches the exposed pattern into the oxide layer while also partially etching the photoresist. This produces the residue which coats the sidewalls of the etch features while also hardening the photoresist.

In the supercritical removal process 40, supercritical carbon dioxide and a solvent are used to remove the photoresist and the residue. In the metal deposition step 42, a metal layer is deposited on the wafer filling the etched pattern and also covering non-etched regions. In subsequent processing, at least part of the metal covering non-etched regions is removed in order to form a circuit.

Figure 3:
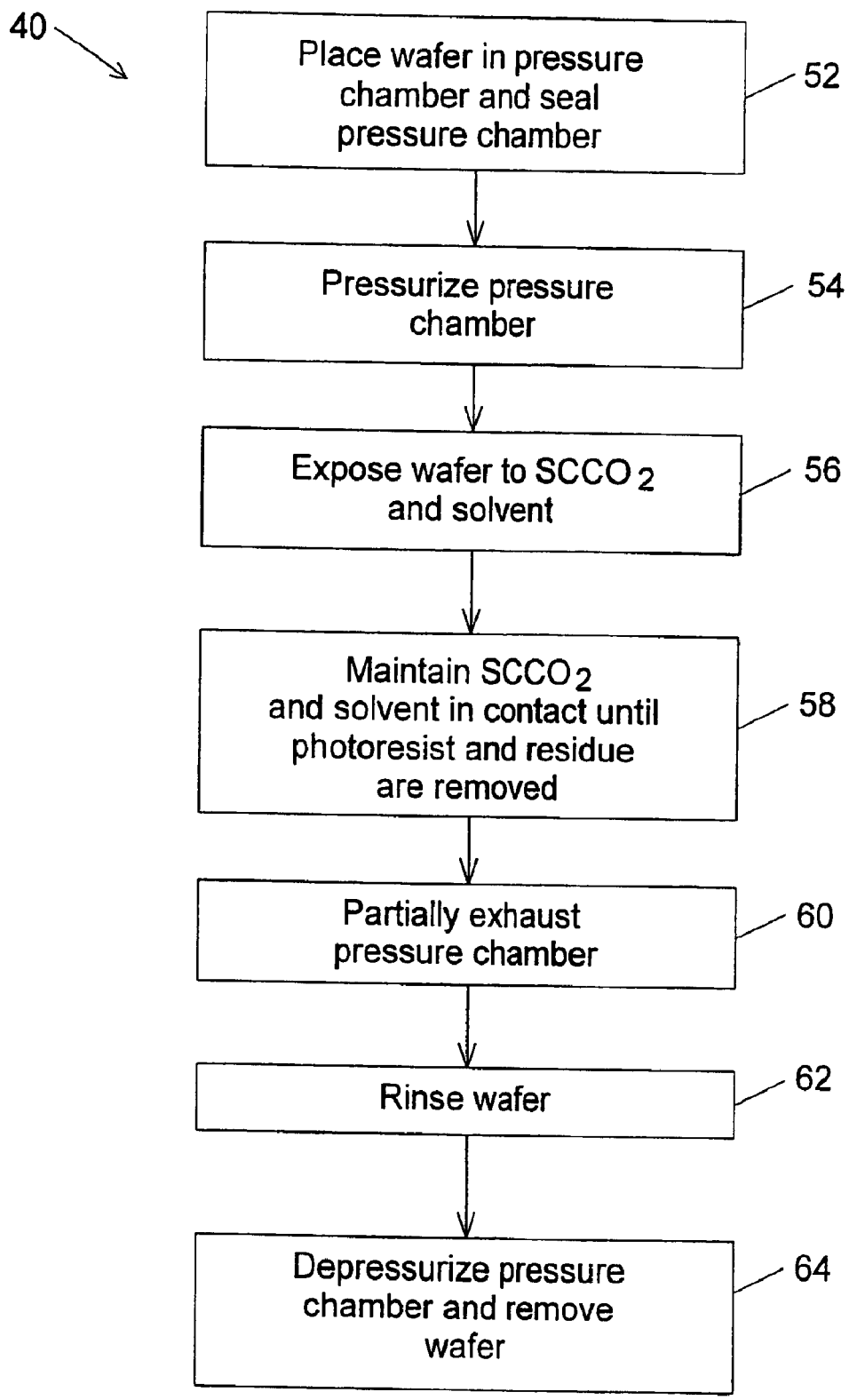
FIG. 3 illustrates, in block diagram format, a supercritical removal process of the present invention.

The supercritical removal process 40 of the present invention is illustrated, as a block diagram, in FIG. 3. The supercritical removal process 40 begins by placing the wafer, with the photoresist and the residue on the wafer, within a pressure chamber and sealing the pressure chamber in a first process step 52. Embodiments of the present invention can be used to process wafers of various sizes, including those having diameters of 3, 4, 5, 6, 8, 12, or more inches. In a second process step 54, the pressure chamber is pressurized with carbon dioxide until the carbon dioxide becomes the supercritical carbon dioxide ($SCCO_2$). In a third process step 56, the supercritical carbon dioxide carries a solvent into the process chamber. In a fourth process step 58, the supercritical carbon dioxide and the solvent are maintained in contact with the wafer until the photoresist and the residue are removed from the wafer. In the fourth process step 58, the solvent at least partially dissolves the photoresist and the residue. In a fifth process step 60, the pressure chamber is partially exhausted. In a sixth process step 62, the wafer is rinsed. In a seventh process step 64, the supercritical removal process 40 ends by depressurizing the pressure chamber and removing the wafer.

Figure 4:
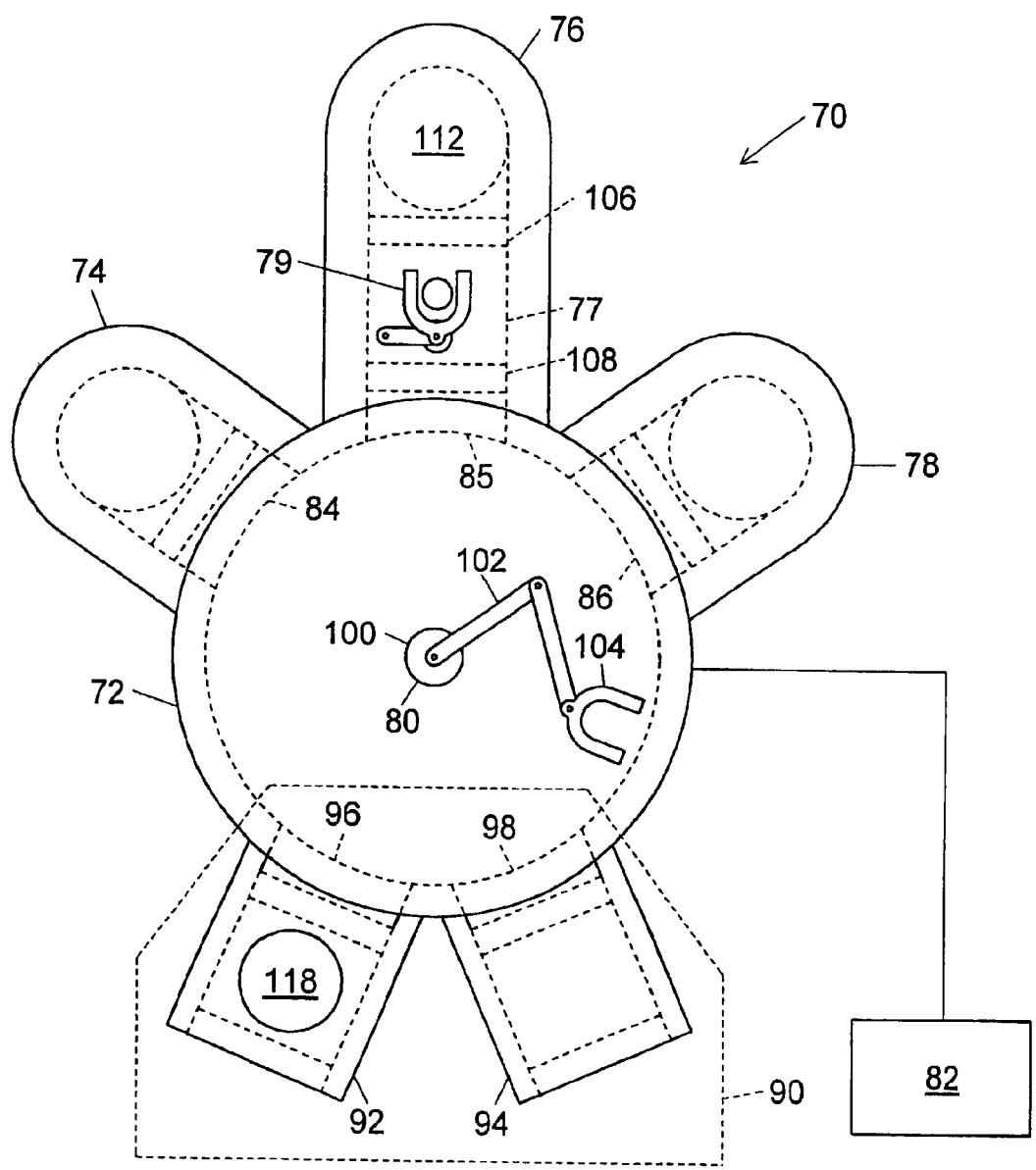
FIG. 4 illustrates the preferred semiconductor processing system of the present invention.

The dielectric etch step 38, the supercritical removal process 40, and the metal deposition step 42 are preferably implemented in a semiconductor fabrication line by the preferred semiconductor processing system of the present invention, which is illustrated in FIG. 4. The preferred semiconductor processing system 70 includes a transfer module 72, an etch module 74, a supercritical processing module 76, an ante-chamber 77, an ante-chamber robot 79, a deposition module 78, a transfer module robot 80, and control electronics 82. The transfer module 72 includes first through third process ports, 84–86, and a transfer module entrance 90. The transfer module entrance 90 includes first and second hand-off stations, 92 and 94, and first and second entrance ports, 96 and 98.

The etch module 74, the supercritical processing module 76 via the ante-chamber 77, and the deposition module 78 are preferably coupled to the transfer module 72 via the first through third process ports, 84–86, respectively. Preferably, the transfer module robot 80 is coupled to the transfer module 72 at a center of the transfer module 72. The first and second hand-off stations, 92 and 94, are coupled to the transfer module via the first and second entrance ports, 96 and 98, respectively. Preferably, the first and second hand-off stations, 92 and 94, comprise first and second loadlocks, respectively. The control electronics 82 are coupled to the transfer module 72.

Preferably, the transfer module 72 operates at low to high vacuum. Preferably, the etch module 74 is an RIE (reactive ion etch) module. The RIE module preferably operates at the high vacuum. Preferably, the deposition module 78 is a PVD (physical vapor deposition) module. The PVD module preferably operates at very-high vacuum or ultra-high vacuum.

It will be readily apparent to one skilled in the art that the RIE module could be replaced by an alternative etch module such as a plasma etch module. Further, it will be readily apparent to one skilled in the art that the PVD module could be replaced by an alternative deposition module such as a CVD (chemical vapor deposition) module. Moreover, it will be readily apparent to one skilled in the art that the preferred semiconductor processing system 70 could be configured with just the etch module 74 and the supercritical processing module 76, or with just the supercritical processing module 76 and the deposition module 78.

The transfer module robot 80 preferably includes a robot base 100, a robot arm 102, and an end effector 104. The robot base is coupled to the transfer module 72. The robot arm 102 is preferably a two piece robot arm, which couples the end effector 104 to the robot base 100. The end effector 104 is configured to pick and place workpieces. Preferably, the end effector 104 is configured to pick and place the wafer. Alternatively, the end effector 104 is configured to pick and place a puck or other substrate. Alternatively, a dual arm robot replaces the transfer module robot 80, where the dual arm robot includes two arms and two end effectors.

The supercritical processing module 76 preferably includes a first gate valve 106. The first-gate valve 106 couples a workpiece cavity 112 to the ante-chamber 77. The ante-chamber 77 preferably includes a second gate valve 108. The second gate valve 108 couples the ante-chamber 77 to the transfer module 72.

Preferably, in operation, the transfer module robot 80 transfers the workpiece 118 from the first hand-off station 92 to the etch module 74, where the dielectric etch step 38 is performed. Next, the transfer module robot 80 transfers the wafer 118 from the etch module 74, to the transfer module 72, and to the ante-chamber 77 of the supercritical processing module 76. The second gate valve 108 then closes and the ante-chamber 77 is preferably pressurized with carbon dioxide. In one embodiment, the ante-chamber 77 is pressurized to a pressure similar to a processing pressure within the supercritical processing module 76. In a preferred embodiment, this pressure generated within the ante-chamber 77 is at least 1,000 psi, and is generated using supercritical $CO_2$, inert gases, nitrogen, or any similar gases. Next, the ante-chamber robot 79 transfers the workpiece 118 from the ante-chamber 77 to the supercritical processing module 76, where the supercritical removal process 40 is performed. Following this, the workpiece is removed from the supercritical processing module 76 to the ante-chamber 77 by the ante-chamber robot 79. Next, the ante-chamber is evacuated by a vacuum pump (not shown). Preferably, the vacuum pump comprising a turbo-pump. Then, the second gate valve 108 opens and the transfer module robot 80 transfers the workpiece 118 from the supercritical processing module 76 to the deposition module 78, where the metal deposition step 42 is performed. Subsequently, the transfer module robot 80 transfers the workpiece 118 from the metal deposition module 78 to the second hand-off station 94.

Preferably, the workpiece 118 is the wafer. Preferably, the wafer is in a first cassette with other wafers at the first hand-off station 92 prior to the transfer module robot 80 moving the wafer to the etch module 74. It will be readily apparent to one skilled in the art that some of the other wafers can be processed simultaneously with the wafer. For example, while the wafer is within the deposition module 78, a second wafer could be within the supercritical processing module 76, and a third wafer could be within the etch module 74.

Preferably, the wafer is placed by the transfer module robot 80 in a second cassette at the second hand-off station 94 following the metal deposition step. Alternatively, the wafer begins and ends in the first cassette at the first hand-off station 92 along with the other wafers while a second group of wafers begins and ends in the second cassette at the second hand-off station 94.

It will be readily apparent to one skilled in the art that the second hand-off station 94 can be eliminated or that additional hand-off stations can be added to the preferred semiconductor processing system 70. Further, it will be readily apparent to one skilled in the art that the transfer module robot 80 can be replaced by a transfer mechanism which is configured to transfer the workpiece 118. Moreover, it will be readily apparent to one skilled in the art that the first and second cassettes can be front opening unified pods which employ a standard mechanical interface concept so that the wafers can be maintained in a clean environment separate from a surrounding environment.

Figure 5:
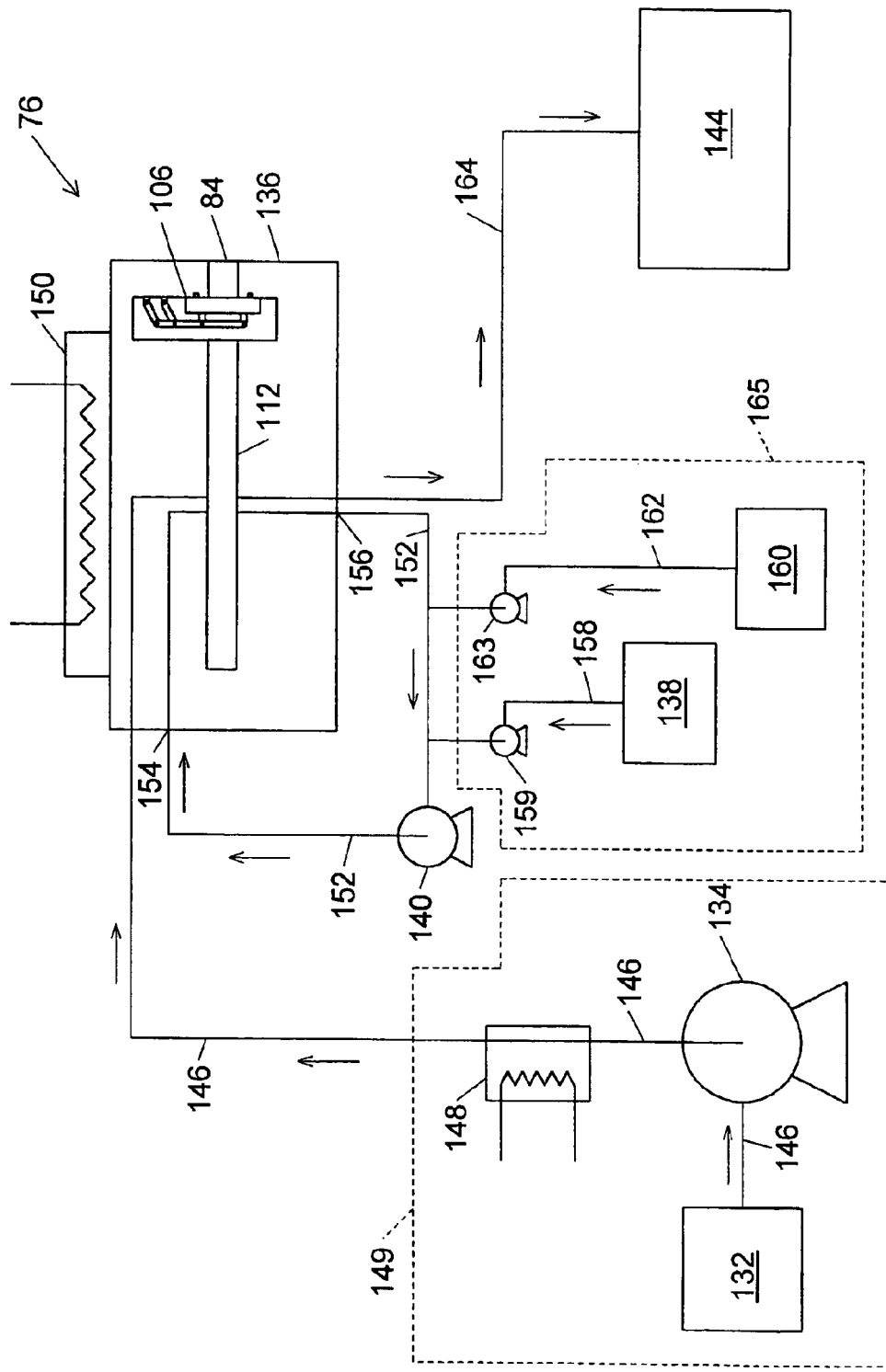
FIG. 5 illustrates the preferred semiconductor processing module of the present invention.

The supercritical processing module 76 of the present invention is illustrated in FIG. 5. The supercritical processing module 76 includes a carbon dioxide supply vessel 132, a carbon dioxide pump 134, the pressure chamber 136, a chemical supply vessel 138, a circulation pump 140, and an exhaust gas collection vessel 144. The carbon dioxide supply vessel 132 is coupled to the pressure chamber 136 via the carbon dioxide pump 134 and carbon dioxide piping 146. The carbon dioxide piping 146 includes a carbon dioxide heater 148 located between the carbon dioxide pump 134 and the pressure chamber 136. The pressure chamber 136 includes a pressure chamber heater 150. The circulation pump 140 is located on a circulation line 152, which couples to the pressure chamber 136 at a circulation inlet 154 and at a circulation outlet 156. The chemical supply vessel 138 is coupled to the circulation line 152 via a chemical supply line 158, which includes a first injection pump 159. A rinse agent supply vessel 160 is coupled to the circulation line 152 via a rinse supply line 162, which includes a second injection pump 163. The exhaust gas collection vessel 144 is coupled to the pressure chamber 136 via exhaust gas piping 164.

The carbon dioxide supply vessel 132, the carbon dioxide pump 134, and the carbon dioxide heater 148 form a carbon dioxide supply arrangement 149. The chemical supply vessel 138, the first injection pump 159, the rinse agent supply vessel 160, and the second injection pump 163 form a chemical and rinse agent supply arrangement 165.

It will be readily apparent to one skilled in the art that the supercritical processing module 76 includes valving, control electronics, filters, and utility hookups which are typical of supercritical fluid processing systems.

Referring to FIGS. 3, 4, and 5, implementation of the supercritical removal method 40 begins with the first process step 52, in which the wafer, having the photoresist or the residue (or both the photoresist and the residue) is inserted into the wafer cavity 112 of the pressure chamber 136 by the ante-chamber robot 79 and, then, the pressure chamber 136 is sealed by closing the gate valve 106. In the second process step 54, the pressure chamber 136 is pressurized by the carbon dioxide pump 134 with the carbon dioxide from the carbon dioxide supply vessel 132. During the second step 54, the carbon dioxide is heated by the carbon dioxide heater 148 while the pressure chamber 136 is heated by the pressure chamber heater 150 to ensure that a temperature of the carbon dioxide in the pressure chamber 136 is above a critical temperature. The critical temperature for the carbon dioxide is 31° C. Preferably, the temperature of the carbon dioxide in the pressure chamber 136 is within a range of 45° C. to 75° C. Alternatively, the temperature of the carbon dioxide in the pressure chamber 136 is maintained within a range of from 31° C. to about 100° C.

Upon reaching initial supercritical conditions, the first injection pump 159 pumps the solvent from the chemical supply vessel 138 into the pressure chamber 136 via the circulation line 152 while the carbon dioxide pump further pressurizes the supercritical carbon dioxide in the third process step 56. At a beginning of a solvent injection, the pressure in the pressure chamber 136 is preferably about 1,100–1,200 psi. Once a desired amount of the solvent has been pumped into the pressure chamber 136 and desired supercritical conditions are reached, the carbon dioxide pump 134 stops pressurizing the pressure chamber 136, the first injection pump 159 stops pumping the solvent into the pressure chamber 136, and the circulation pump 140 begins circulating the supercritical carbon dioxide and the solvent in the fourth process step 58. Preferably, the pressure at this point is about 2,700–2,800 psi. By circulating the supercritical carbon dioxide and the solvent, the supercritical carbon dioxide maintains the solvent in contact with the wafer. Additionally, by circulating the supercritical carbon dioxide and the solvent, a fluid flow enhances removal of the photoresist and the residue from the wafer.

Preferably, the wafer is held stationary in the pressure chamber 136 during the fourth process step 58. Alternatively, the wafer is spun within the pressure chamber 136 during the fourth process step 58.

After the photoresist and the residue has been removed from the wafer, the pressure chamber 136 is partially depressurized by exhausting some of the supercritical carbon dioxide, the solvent, removed photoresist, and removed residue to the exhaust gas collection vessel 144 in order to return conditions in the pressure chamber 136 to near the initial supercritical conditions in the fifth process step 60. Preferably, the pressure within the pressure chamber 136 is cycled at least once at this point by raising the pressure and then again partially exhausting the pressure chamber 136. This enhances a cleanliness within the pressure chamber 136. In the fifth process step 60, the pressure chamber is preferably maintained above the critical temperature and above a critical pressure. The critical pressure for carbon dioxide is 1,070 psi.

In the sixth process step 62, the second injection pump 163 pumps a rinse agent from the rinse agent supply vessel 160 into the pressure chamber 136 via the circulation line while the carbon dioxide pump 134 pressurizes the pressure chamber 136 to near the desired supercritical conditions and, then, the circulation pump 140 circulates the supercritical carbon dioxide and the rinse agent in order to rinse the wafer. Preferably, the rinse agent is selected from the group consisting of water, alcohol, acetone, and a mixture thereof. More preferably, the rinse agent is the mixture of the alcohol and the water. Preferably, the alcohol is selected from the group consisting of isopropyl alcohol, ethanol, and other low molecular weight alcohols. More preferably, the alcohol is selected from the group consisting of the isopropyl alcohol and the ethanol. Most preferably, the alcohol is the ethanol.

Preferably, the wafer is held stationary in the pressure chamber 136 during the sixth process step 62. Alternatively, the wafer is spun within the pressure chamber 136 during the sixth process step 62.

In the seventh process step 64, the pressure chamber 136 is depressurized, by exhausting the pressure chamber 136 to the exhaust gas collection vessel 144, the gate valve 106 is opened, and the wafer is removed from the pressure chamber 136 by the ante-chamber robot 77.

Alternative supercritical removal processes of the present invention are taught in the following patent applications, all of which are incorporated in their entirety by reference: U.S. patent application Ser. No. 09/697,227, filed on Oct. 25, 2000; U.S. patent application Ser. No. 09/389,788, filed on Sep. 3, 1999; U.S. patent application Ser. No. 09/085,391, filed on May 27, 1998; and U.S. Provisional Patent Application No. 60/047,739, filed May 27, 1997.

Figure 6:
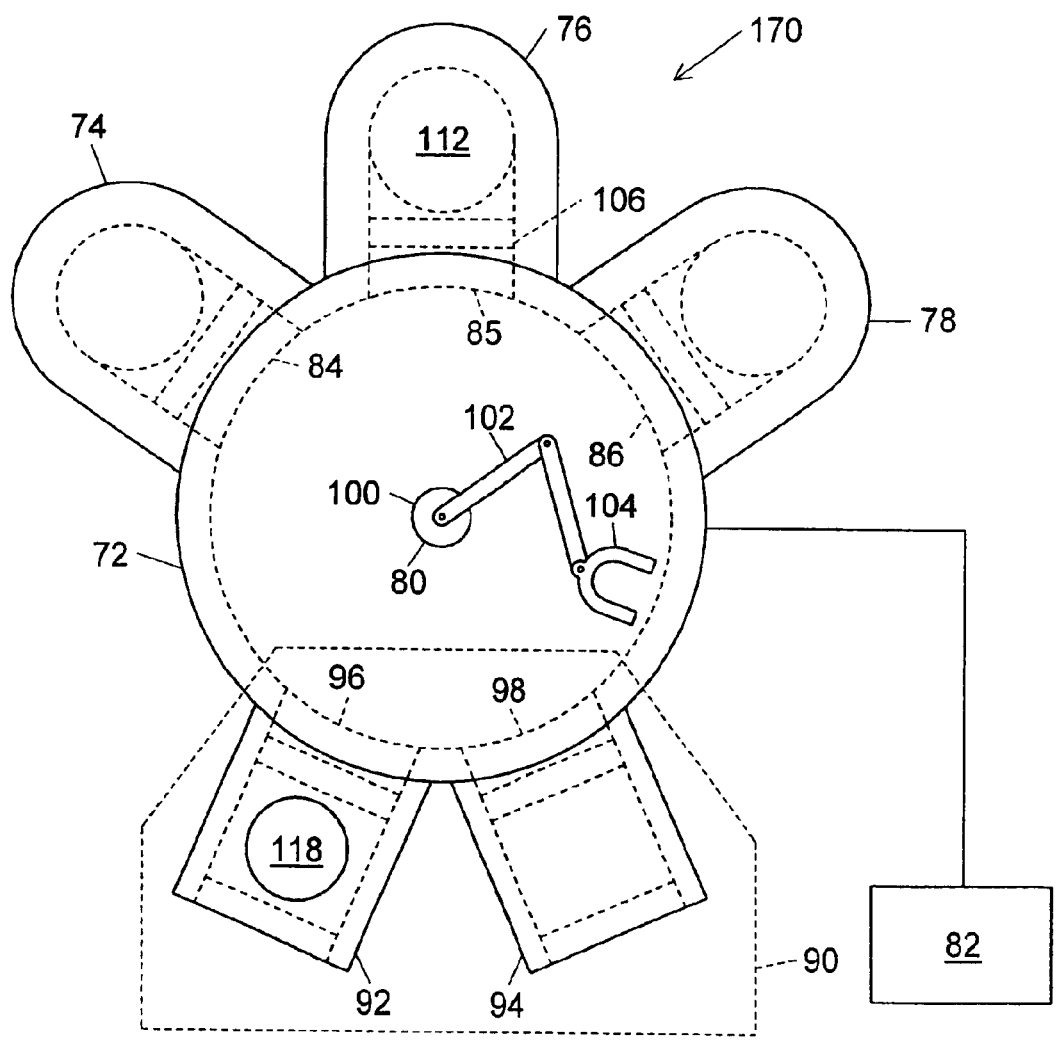
FIG. 6 illustrates a first alternative semiconductor processing system of the present invention.

A first alternative semiconductor processing system of the present invention is illustrated in FIG. 6. The first alternative semiconductor processing system 170 removes both the ante-chamber 77 and the ante-chamber robot 79 from the preferred semiconductor processing system 70. In the first alternative semiconductor processing system 170, the supercritical processing module 76 is preferably coupled directly to the second processing port 85 and the vacuum pump is coupled to the supercritical processing module 76. Thus, in the first alternative semiconductor processing system 170, the supercritical processing module 76 operates between vacuum and supercritical conditions.

Figure 7:
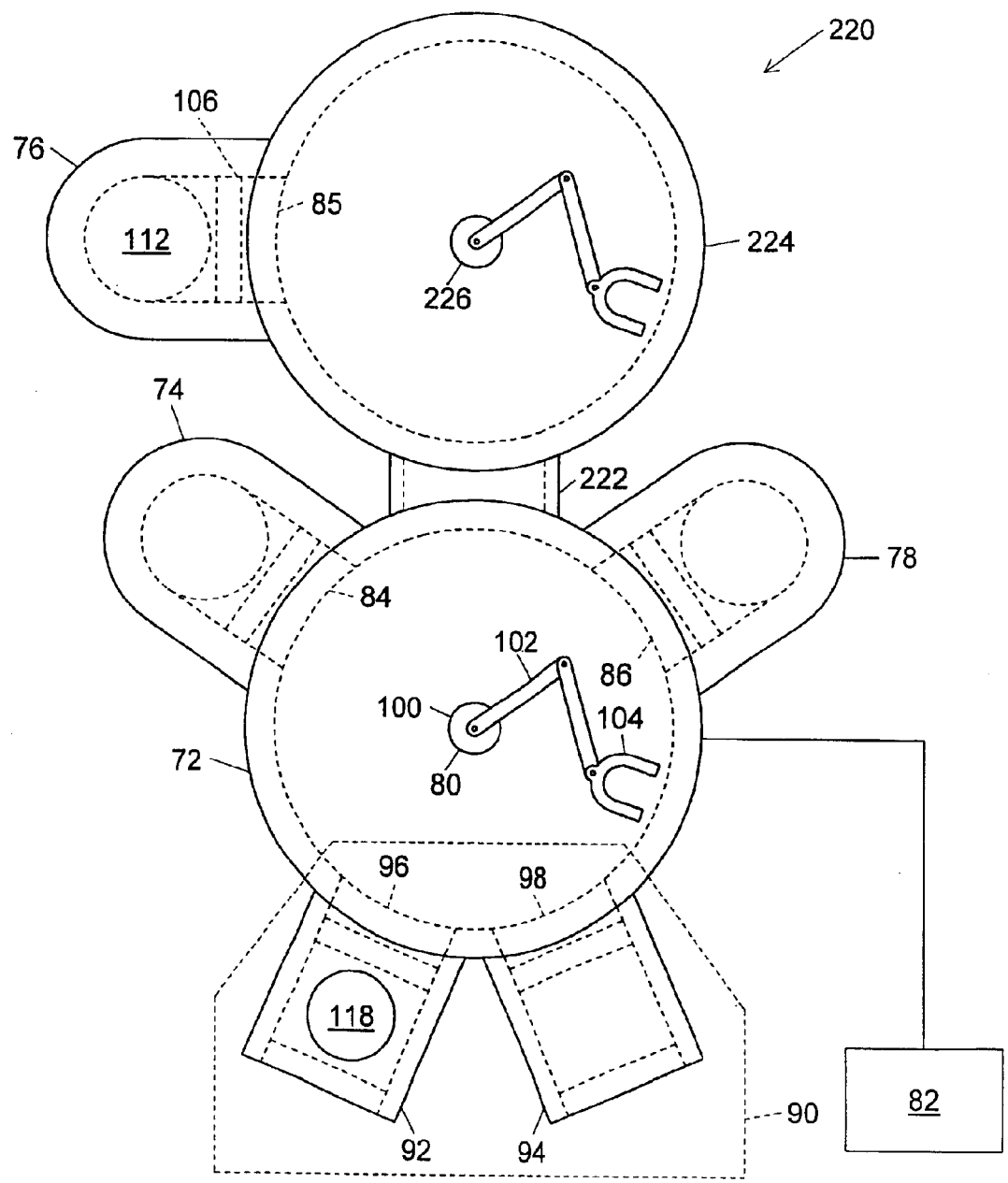
FIG. 7 illustrates a second alternative semiconductor processing system of the present invention.

A second alternative semiconductor processing system of the present invention is illustrated in FIG. 7. The second alternative semiconductor processing system 220 adds a third hand-off station 222, a second transfer module 224, and a second transfer module robot 226 to the preferred semiconductor processing system 70. In the second alternative semiconductor processing system 220, the third hand-off station 222 couples the transfer module 72 to the second transfer module 224. The second transfer module robot 226 preferably resides in the second transfer module 224. The etch module 74 and the deposition module 78 are preferably coupled to the transfer module 72 while the supercritical processing module 76 is preferably coupled to the second transfer module 224. Thus, the second alternative semiconductor processing system 220 preferably separates the supercritical processing module 76 from the etch and deposition modules, 74 and 78, which operate at vacuum. In this way, a process cleanliness is enhanced. Alternatively, in the second alternative semiconductor processing system 220, a fourth hand-off station is added between the transfer module 72 and the second transfer module 224.

Figure 8:
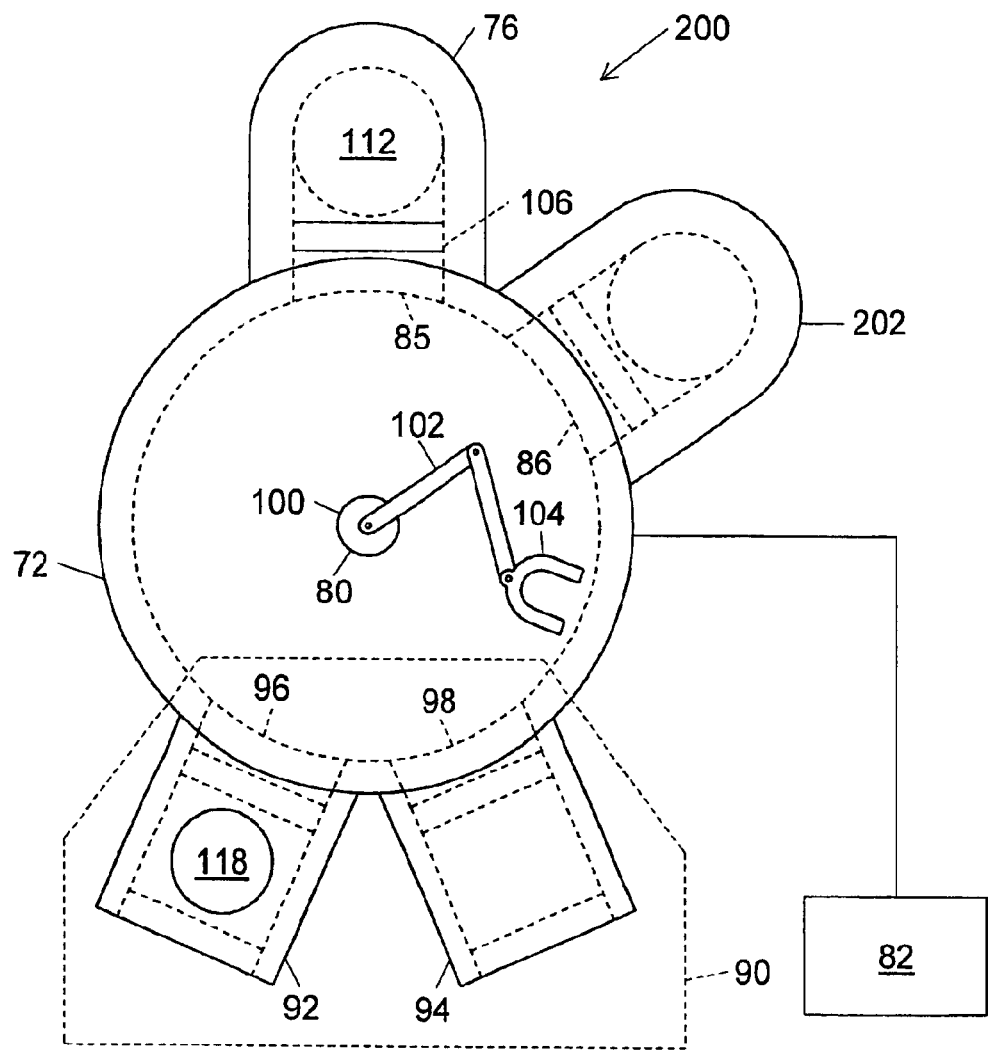
FIG. 8 illustrates a third alternative semiconductor processing system of the present invention.

A third alternative semiconductor processing system of the present invention is illustrated in FIG. 8. The third alternative semiconductor processing system 200 includes the transfer module 72, the supercritical processing module 76, the transfer module robot 80, and a non-supercritical processing module 202. The non-supercritical processing module is preferably a semiconductor processing module. The semiconductor processing module is preferably selected from the group consisting of an etch module, a physical vapor deposition module, a chemical vapor deposition module, an electroplating module, a chemical mechanical planarization module, a photolithography module, an ashing module, a scrubbing module, and an other semiconductor processing module.

In a fourth alternative semiconductor processing system of the present invention, the transfer module 72 of the preferred semiconductor processing system 70 is not operated at vacuum and the first and second hand-off stations, 92 and 94, are preferably not loadlocks. Rather, the transfer module 72 operates at atmospheric pressure or at a slight positive pressure relative to the surrounding environment where the slight positive pressure is produced by an inert gas injection arrangement. The inert gas injection arrangement injects an inert gas, such as Ar, $CO_2$, or $N_2$, into the transfer module 72. This assures a cleaner processing environment within the transfer module 72 if the transfer module is not operated at vacuum.

A fifth alternative semiconductor processing system of the present invention eliminates the transfer module 72 of the fourth alternative semiconductor processing system. In the fifth alternative semiconductor processing system, the transfer module robot 80 is simple a robot that is configured to move workpieces between the first and second hand-off stations, 92 and 94, and the etch module 74, the supercritical processing module 76, and the deposition module 78 without benefitting from a covering effect provided by the transfer module 72.

A sixth alternative semiconductor processing system of the present invention adds an inspection station to the preferred semiconductor processing system 70. In the sixth alternative semiconductor processing system, the workpiece 118 is transferred to the inspection station prior to being transferred to the deposition module 78. At the inspection station, an inspection of the workpieces 118 ensures that the photoresist and the residue have been removed from the workpieces. Preferably, the inspection station uses spectroscopy to inspect the workpieces. Alternatively, the inspection station is incorporated within the supercritical processing module 76.

Alternatively, in operation of the sixth alternative semiconductor processing system, the workpiece 118 is transferred to the inspection station directly from the etch module 74 if it is anticipated that the photoresist will be etched to completion and if it is anticipated that the residue will not be deposited. Thus, if the inspection station finds that no photoresist remains and also finds no residue, the supercritical removal process 40 will be skipped.

A seventh alternative semiconductor processing system of the present invention adds a front-end robot to the preferred semiconductor processing system 70. In the seventh alternative semiconductor processing system, the front-end robot resides outside of the entrance to the transfer module 72 and the first and second cassettes are located away from the first and second hand-off stations, 92 and 94. The front-end robot is preferably configured to move the wafers from the first cassette to the first hand-off station 92 and is also preferably configured to move the wafers from the second hand-off station 94 to the second cassette.

Figure 9:
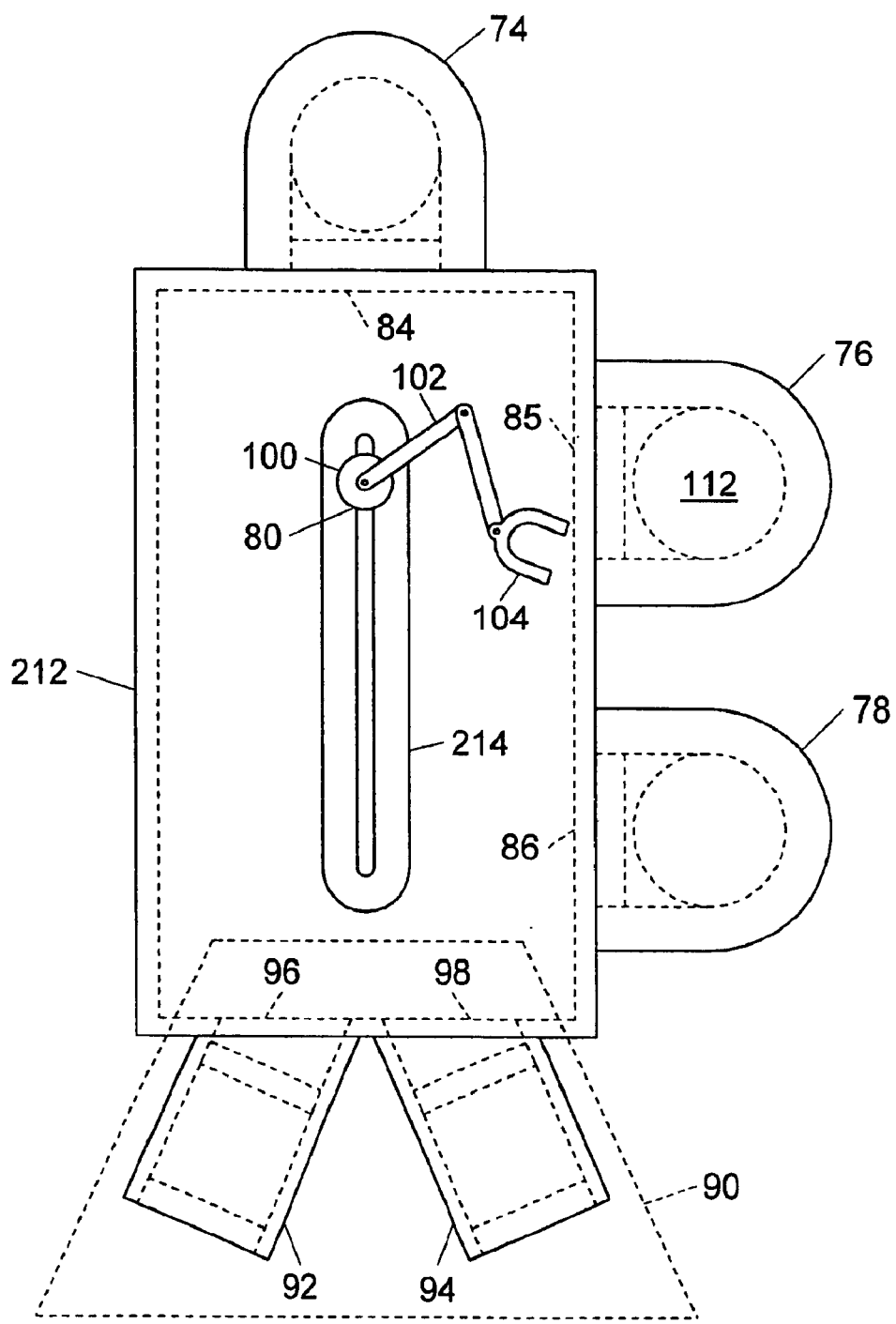
FIG. 9 illustrates an eighth alternative semiconductor processing system of the present invention.

An eighth alternative semiconductor processing systems of the present invention is illustrated in FIG. 9. The eighth semiconductor processing system 210 comprises an alternative transfer module 212 and a robot track 214.

An ninth alternative semiconductor processing system of the present invention adds a wafer orientation mechanism to the preferred semiconductor processing system 70. The wafer orientation mechanism orients the wafer according to a flat, a notch, or an other orientation indicator. Preferably, the wafer is oriented at the first hand-off station 92. Alternatively, the wafer is oriented at the second hand-off station 94.

A first alternative supercritical processing module of the present invention replaces the pressure chamber 136 and gate valve 106 with an alternative pressure chamber. The alternative pressure chamber comprises a chamber housing and a hydraulicly driven wafer platen. The chamber housing comprises a cylindrical cavity which is open at its bottom. The hydraulicly driven wafer platen is configured to seal against the chamber housing outside of the cylindrical cavity. In operation, the wafer is placed on the hydraulicly driven wafer platen. Then, the hydraulicly driven wafer platen moves upward and seals with the chamber housing. Once the wafer has been processed, the hydraulicly driven wafer platen is lowered and the wafer is taken away.

A second alternative supercritical processing module of the present invention places alternative inlets for the circulation line 152 to enter the wafer cavity 112 at a circumference of the wafer cavity 112 and places an alternative outlet at a top center of the wafer cavity 112. The alternative inlets are preferably configured to inject the supercritical carbon dioxide in a plane defined by the wafer cavity 112. Preferably, the alternative inlets are angled with respect to a radius of the wafer cavity 112 so that in operation the alternative inlets and the alternative outlet create a vortex within the wafer cavity 112.

It will be readily apparent to one skilled in the art that other various modifications may be made to the preferred embodiment without departing from the spirit and scope of the invention as defined by the appended claims.

We claim:

1. An apparatus for supercritical processing of a workpiece, the apparatus comprising:
    a. a transfer module;
    b. a first supercritical processing module with a wafer cavity having a constant volume for holding the workpiece during processing, the first supercritical processing module configured to cycle a pressure within the wafer cavity;
    c. an antechamber coupling the transfer module to a single processing module, wherein the single processing module is the first supercritical processing module and the antechamber is configured to withstand pressures above 1,000 psi;
    d. a first gate valve coupling the antechamber to the first supercritical processing module;
    e. a second processing module coupled to the transfer module, wherein the second processing module is one of a second supercritical processing module, a vacuum processing module, and an atmospheric processing module;

f. a first transfer mechanism coupled to the transfer module, the transfer mechanism configured to move the workpiece between the transfer module and the antechamber; and g. a second transfer mechanism coupled to the antechamber and configured to move the workpiece between the antechamber and the first supercritical processing module.

2. The apparatus of claim 1, wherein the second processing module is one of an etch module, an electroplating module, a chemical mechanical planarization module, a photolithography module, a deposition module, and their combination.

3. The apparatus of claim 2, wherein the deposition module is one of a physical vapor deposition module, a chemical vapor deposition module, and their combination.

4. The apparatus of claim 1, further comprising a pressurizer coupled to the first supercritical processing module and configured to pressurize a material within the first supercritical processing module.

5. The apparatus of claim 4, wherein the pressurizer comprises:

a. a $CO_2$ supply vessel; and b. a pump coupling to $CO_2$ supply vessel to the first supercritical processing module.

6. The apparatus of claim 1, wherein the transfer module comprises a means for producing a vacuum within the transfer module.

7. The apparatus of claim 6, wherein the transfer module further comprises a means for maintaining a pressure within the transfer module configured to be a slight positive pressure relative to the surrounding environment.

8. The apparatus of claim 7, wherein the means for maintaining a slight positive pressure within the transfer module comprises an inert gas injection arrangement.

9. The apparatus of claim 1, wherein the first transfer mechanism comprises a first robot.

10. The apparatus of claim 9, wherein the second transfer mechanism comprises a second robot.

11. The apparatus of claim 1, wherein the first supercritical processing module comprises:

a. a plurality of inlets positioned along a circumference of the wafer cavity and configured to inject a supercritical material into the wafer cavity; and b. an outlet positioned along a top center of the wafer cavity and configured to exhaust the supercritical material from the wafer cavity.

12. The apparatus of claim 1, wherein the antechamber is sized to accommodate only a single workpiece.

13. The apparatus of claim 1, further comprising a second gate valve coupling the transfer module to the antechamber.

14. The apparatus of claim 13, wherein the first gate valve and the second gate valve are both configured to withstand pressures above 1,000 psi.

15. The apparatus of claim 1, wherein the first supercritical processing module is sized to accommodate a wafer having a diameter larger than 8 inches.

16. An apparatus for supercritical processing of a workpiece, the apparatus comprising:

a. a transfer module;

b. a first supercritical processing module with a wafer cavity defined by cavity walls, the wafer cavity for holding the workpiece during processing, the cavity walls remaining substantially rigid during processing;

c. an antechamber coupling the transfer module to a single processing module, wherein the single processing module is the first supercritical processing module and the antechamber is configured to withstand pressures above 1,000 psi;

d. a second processing module coupled to the transfer module, wherein the second processing module is one of a second supercritical processing module, a vacuum processing module, and an atmospheric processing module;

e. a first transfer mechanism coupled to the transfer module, the transfer mechanism configured to move the workpiece between the transfer module and the antechamber; and f. a second transfer mechanism coupled to the antechamber and configured to move the workpiece between the antechamber and the first supercritical processing module.

* * * * *

UNITED STATES PATENT AND TRADEMARK OFFICE
CERTIFICATE OF CORRECTION

PATENT NO. : 6,926,798 B2
DATED : August 9, 2005
INVENTOR(S) : Maximilian A. Biberger et al.

It is certified that error appears in the above-identified patent and that said Letters Patent is hereby corrected as shown below:

<u>Title page,</u>
Item [56], References Cited, U.S. PATENT DOCUMENTS, add
-- 5,169,408      12/1992         Biggerstaff et al. --.
FOREIGN PATENT DOCUMENTS, add
-- JP    40 5283511 A   10/1993        …….. H01L/21/68
   JP    40 5283511 A   10/1993        …….. H01L/21/68 --.

<u>Column 11,</u>
Line 27, replace "coupling to $CO_2$ supply" with -- coupling the $CO_2$ supply --.

Signed and Sealed this

Fourth Day of October, 2005

JON W. DUDAS
*Director of the United States Patent and Trademark Office*